United States Patent
Hamana et al.

(10) Patent No.: US 11,658,003 B2
(45) Date of Patent: May 23, 2023

(54) METHOD FOR PRODUCING PHOSPHOR PANEL, PHOSPHOR PANEL, IMAGE INTENSIFIER AND SCANNING-TYPE ELECTRONIC MICROSCOPE

(71) Applicant: HAMAMATSU PHOTONICS K.K., Hamamatsu (JP)

(72) Inventors: Yasumasa Hamana, Hamamatsu (JP); Hiroyuki Watanabe, Hamamatsu (JP); Kenshi Shimano, Hamamatsu (JP); Hiroji Nishizawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 135 days.

(21) Appl. No.: 17/430,019

(22) PCT Filed: Nov. 22, 2019

(86) PCT No.: PCT/JP2019/045826
§ 371 (c)(1),
(2) Date: Aug. 11, 2021

(87) PCT Pub. No.: WO2020/170532
PCT Pub. Date: Aug. 27, 2020

(65) Prior Publication Data
US 2022/0148848 A1 May 12, 2022

(30) Foreign Application Priority Data

Feb. 20, 2019 (JP) .............................. JP2019-028122

(51) Int. Cl.
*H01J 37/22* (2006.01)
*H01J 9/22* (2006.01)

(52) U.S. Cl.
CPC .............. *H01J 37/224* (2013.01); *H01J 9/22* (2013.01)

(58) Field of Classification Search
CPC .. H01J 37/224; H01J 9/22; H01J 37/27; H01J 2237/2443; H01J 2237/2445; H01J 37/28; H01J 37/244; C09K 11/02; C09K 11/025
See application file for complete search history.

(56) References Cited

U.S. PATENT DOCUMENTS 2,729,583 A * 1/1956 Sadowsky ............... H01J 9/227
156/239
3,484,240 A * 12/1969 Jonkers ................. H01J 9/2271
430/26
(Continued)

FOREIGN PATENT DOCUMENTS

| EP | 0889483 A1 | 1/1999 |
| EP | 1111026 A1 | 6/2001 |

(Continued)

OTHER PUBLICATIONS

International Preliminary Report on Patentability dated Sep. 2, 2021 for PCT/JP2019/045826.

*Primary Examiner* — David A Vanore
(74) *Attorney, Agent, or Firm* — Faegre Drinker Biddle & Reath LLP (57) ABSTRACT

A method of manufacturing a phosphor panel includes: forming a phosphor layer having a plurality of phosphor particles on an exit window; forming an organic film on the phosphor layer; forming a metal reflection film on the organic film; forming an oxide film on the metal reflection film; removing the organic film by firing; and forming an oxide film integrally covering a surface of the metal reflection film and surfaces of the phosphor particles by atomic layer deposition.

13 Claims, 9 Drawing Sheets (56) References Cited

U.S. PATENT DOCUMENTS

| | | | |
|---|---|---|---|
| 4,104,647 A * | 8/1978 | Sheldon | G03G 15/321 |
| | | | 347/121 |
| 9,944,851 B2 * | 4/2018 | Nishimata | H01L 33/502 |
| 10,662,375 B2 * | 5/2020 | Nishimata | C09K 11/77348 |
| 10,836,958 B2 * | 11/2020 | Nakamura | G02B 5/20 |
| 10,927,298 B2 * | 2/2021 | Nishimata | H01L 33/486 |
| 2014/0061481 A1 * | 3/2014 | Kondo | G01T 1/2012 |
| | | | 250/361 R |
| 2015/0214444 A1 * | 7/2015 | Watanabe | C09K 11/7774 |
| | | | 252/301.4 F |
| 2015/0279639 A1 * | 10/2015 | Nakamura | H01J 43/246 |
| | | | 445/51 |

FOREIGN PATENT DOCUMENTS

| | | |
|---|---|---|
| JP | S52-016542 A | 2/1977 |
| JP | S53-118967 A | 10/1978 |
| JP | S60-049544 A | 3/1985 |
| JP | H01-243345 A | 9/1989 |
| JP | 2010-267634 A | 11/2010 |
| JP | 2013-093172 A | 5/2013 |
| JP | 2013-216800 A | 10/2013 |
| JP | 2016-095189 A | 5/2016 |

\* cited by examiner

METHOD FOR PRODUCING PHOSPHOR PANEL, PHOSPHOR PANEL, IMAGE INTENSIFIER AND SCANNING-TYPE ELECTRONIC MICROSCOPE

TECHNICAL FIELD

The present disclosure relates to a method of manufacturing a phosphor panel, a phosphor panel, an image intensifier, and a scanning electron microscope.

BACKGROUND ART

In the related art, for example, in an image intensifier, a scanning electron microscope, and the like, a phosphor panel is used as an electron detection unit that detects photoelectrons. For example, Patent Document 1 discloses that a phosphor layer (fluorescence film) is formed of a particulate fluorescence substance, and a metal reflection film (aluminum layer) is provided on an electron incident surface side of the phosphor layer to prevent charge-up of the phosphor layer. Patent Document 1 discloses a method of forming a metal reflection film on a nitrocellulose film after forming the nitrocellulose film on the phosphor layer, then forming the metal reflection film on the phosphor layer by removing the nitrocellulose film.

CITATION LIST

Patent Document

[Patent Document 1] Japanese Unexamined Patent Publication No. H1-243345

SUMMARY OF INVENTION

Technical Problem

In the method of forming the metal reflection film described above, since the nitrocellulose film is interposed between the phosphor layer and the metal reflection film, the metal reflection film is not directly formed on the phosphor layer. Therefore, the metal reflection film is not sufficiently adhered to the phosphor layer, and is relatively easily peeled off from the phosphor layer. In addition, the peeling of the metal reflection film may cause deterioration in quality of a product including the phosphor panel as an electron detector. For example, in an image intensifier, the peeling of the metal reflection film may cause deterioration in image quality.

Therefore, it is an object of the present disclosure to provide a method of manufacturing a phosphor panel, a phosphor panel, an image intensifier, and a scanning electron microscope, which can effectively suppress peeling of a metal reflection film.

Solution to Problem

According to an aspect of the present disclosure, a method of manufacturing a phosphor panel includes: forming a phosphor layer having a plurality of phosphor particles on a light transmissive substrate; forming an organic film on the phosphor layer; forming a metal reflection film on the organic film; removing the organic film by firing; and forming an oxide film integrally covering a surface of the metal reflection film and surfaces of the phosphor particles by atomic layer deposition.

In the method of manufacturing the phosphor panel, the metal reflection film is formed on the organic film formed on the phosphor layer. Accordingly, the metal molecules constituting the metal reflection film are prevented from being mixed into the phosphor layer, and the metal reflection film can be appropriately provided on the phosphor layer. After the organic film is removed by firing, an oxide film is formed by atomic layer deposition to integrally cover the surface of the metal reflection film and the surfaces of the phosphor particles. Since the surface of the metal reflection film is protected by the oxide film, the strength of the metal reflection film is improved. In addition, since the adhesion between the metal reflection film and the phosphor layer (phosphor particle) is improved through the oxide film, the metal reflection film is not easily separated from the phosphor layer. Therefore, according to the above manufacturing method, it is possible to manufacture a phosphor panel in which peeling of the metal reflection film is effectively suppressed.

The organic film may be a nitrocellulose film. Accordingly, an organic film suitable for forming a metal reflection film can be suitably formed.

The metal reflection film may be formed by vapor deposition or sputtering. Thus, the metal reflection film can be suitably formed on the organic film. In addition, a metal reflection film having an appropriate opening (pinhole) is formed by vapor deposition or sputtering. Accordingly, in the formation of the oxide film by the atomic layer deposition method, the gas for forming the oxide film can enter the phosphor layer through the opening of the metal reflection film. As a result, the oxide film can be suitably formed.

The manufacturing method may further include forming a second metal reflection film on a first metal reflection film which is the metal reflection film located on the phosphor layer after the organic film is removed, and in the forming the oxide film, the oxide film may be formed to cover the first metal reflection film, the second metal reflection film, and the phosphor particles. In the above manufacturing methods, a part of a metal reflection film (first metal reflection film) initially formed on the organic film may be changed into a metal oxide film or damaged by the firing process. As a result, the first metal reflection film alone may not sufficiently exhibit a function as a metal reflection film such as prevention of charge-up of the phosphor layer. On the other hand, in the above-described manufacturing method, the above-described function as the metal reflection film can be ensured by the first metal reflection film and the second metal reflection film.

A phosphor panel according to an aspect of the present disclosure includes a light transmissive substrate, a phosphor layer disposed on the light transmissive substrate and having a plurality of phosphor particles, a metal reflection film disposed on the phosphor layer, and an oxide film integrally covering a surface of the metal reflection film and surfaces of the phosphor particles.

In the phosphor panel, the oxide film is formed to integrally cover the surface of the metal reflection film and the surfaces of the phosphor particle. Since the surface of the metal reflection film is protected by the oxide film, the strength of the metal reflection film is improved. In addition, since the adhesion between the metal reflection film and the phosphor layer (phosphor particle) is improved through the oxide film, the metal reflection film is not easily separated from the phosphor layer. Therefore, according to the phosphor panel, peeling of the metal reflection film can be effectively suppressed.

The metal reflection film may be an aluminum film. Accordingly, the function as the metal reflection film described above can be suitably exhibited.

The oxide film may be an aluminum oxide film, a titanium oxide film, a zinc oxide film, or a silicon oxide film. Accordingly, the strength of the metal reflection film and the adhesion between the metal reflection film and the phosphor layer can be suitably improved.

The phosphor particle may be gadolinium oxysulfide. Accordingly, the phosphor layer of a phosphor panel used as an electron detector in an image intensifier or the like can be suitably formed.

The phosphor layer may include a binder that binds a plurality of phosphor particles to each other. Thus, the phosphor particles are fixed to each other, and the structure of the phosphor layer can be stabilized.

The binder may be potassium silicate. Accordingly, the phosphor particles can be suitably bonded to each other.

The light transmissive substrate may be a fiber optic plate formed by bundling a plurality of optical fibers. This makes it possible to transmit fluorescence emitted from the phosphor layer to the outside with high efficiency and low distortion.

An image intensifier according to an aspect of the present disclosure includes a photocathode configured to emit photoelectrons in response to incident light, an electron multiplier configured to multiply the photoelectron emitted from the photocathode, and the phosphor panel disposed so that the phosphor layer receives the photoelectron multiplied by the electron multiplier and emits fluorescence corresponding to the photoelectron.

A scanning electron microscope according to an aspect of the present disclosure includes: an electron gun configured to generate an electron beam; an irradiation part configured to irradiate a sample with the electron beam and scan an irradiation position of the electron beam on the sample; and the phosphor panel disposed so that the phosphor layer receives a photoelectron generated in the sample in response to the irradiation of the sample with the electron beam and emits fluorescence corresponding to the photoelectron.

The image intensifier or the scanning electron microscope includes the above-described phosphor panel as an electron detector. As described above, since the metal reflection film is more difficult to peel off from the phosphor panel than in the related art, it is possible to improve handleability of the phosphor panel at the time of manufacturing a product. That is, the phosphor panel can be handled more easily than in the prior art. In addition, since peeling of the metal reflection film is suppressed in the phosphor panel, it is possible to suppress deterioration in quality of a product due to peeling of the metal reflection film. For example, in an image intensifier, it is possible to suppress deterioration in image quality due to peeling of a metal reflection film. In addition, since the phosphor particles are covered with the oxide film, absorption of gas to the phosphor particles (or the binder attached to the phosphor particles) is suppressed, and emission of gas from the phosphor particles during operation of the image intensifier is suppressed. As a result, it is possible to suppress a phenomenon (ion feedback) in which the gas emitted from the phosphor particles is ionized and reaches the photocathode, and to suppress deterioration of the photocathode (deterioration of cathode sensitivity) due to the phenomenon. As a result, the life characteristics (product life) of the image intensifier can be improved.

Advantageous Effects of Invention

According to the present disclosure, it is possible to provide a method of manufacturing a phosphor panel, a phosphor panel, an image intensifier, and a scanning electron microscope that can effectively suppress peeling of a metal reflection film.

BRIEF DESCRIPTION OF DRAWINGS

(A) of FIG. 8 shows a test result of an image intensifier according to a comparative example.

(B) of FIG. 8 shows a test result of the image intensifier according to an example.

DESCRIPTION OF EMBODIMENTS

Hereinafter, embodiments of the present disclosure will be described with reference to the drawings. In the drawings, the same or corresponding portions are denoted by the same reference numerals, and redundant description is omitted. In the drawings, some of the characteristic portions according to the embodiments are exaggerated for easy understanding, and the dimensions may be different from the actual dimensions. In the following description, terms such as "upper" and "lower" are used for convenience based on the state shown in the drawings.

[Structure of Image Intensifier]

Figure 1:
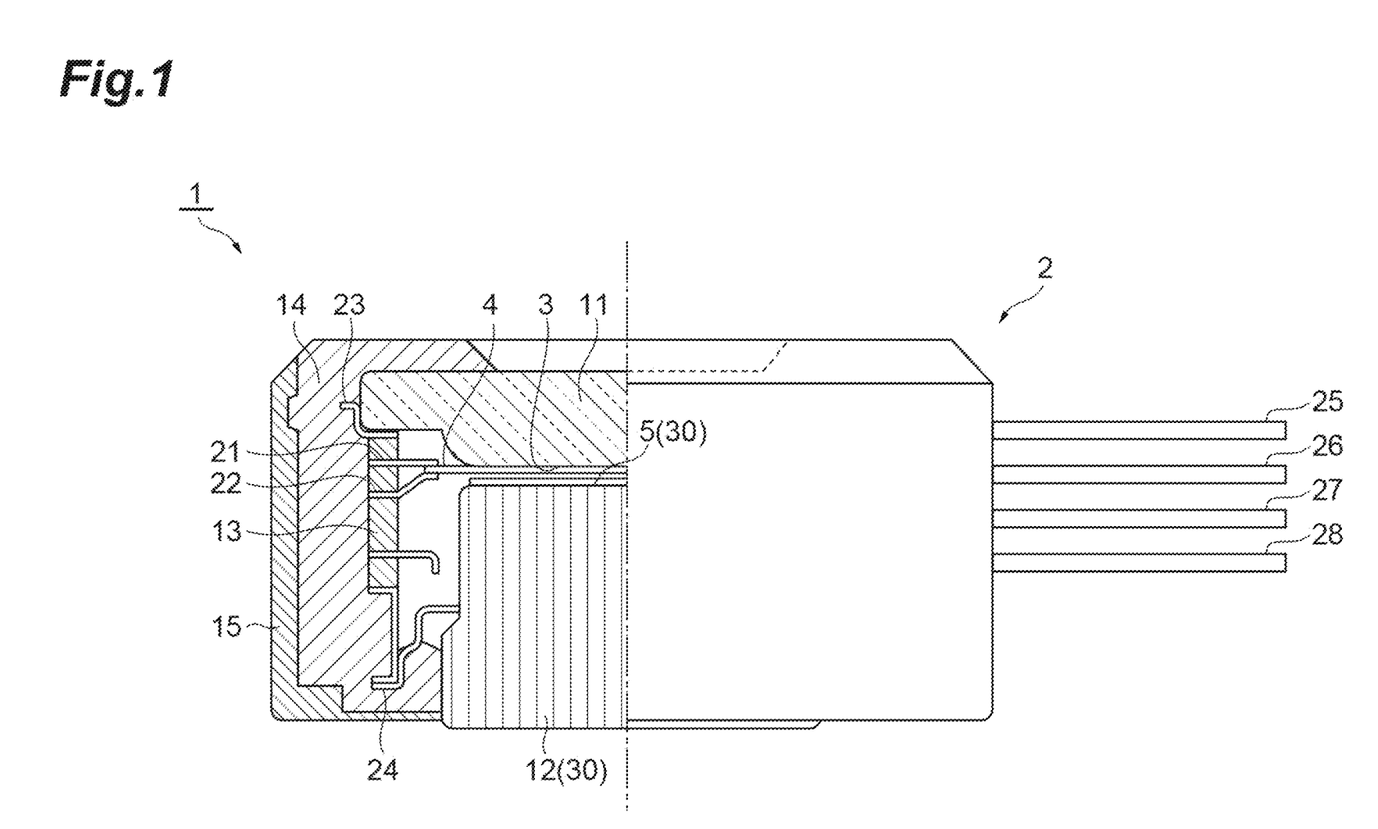
FIG. 1 is a partial cross-sectional view of an image intensifier including a phosphor panel according to an embodiment.
Figure 2:
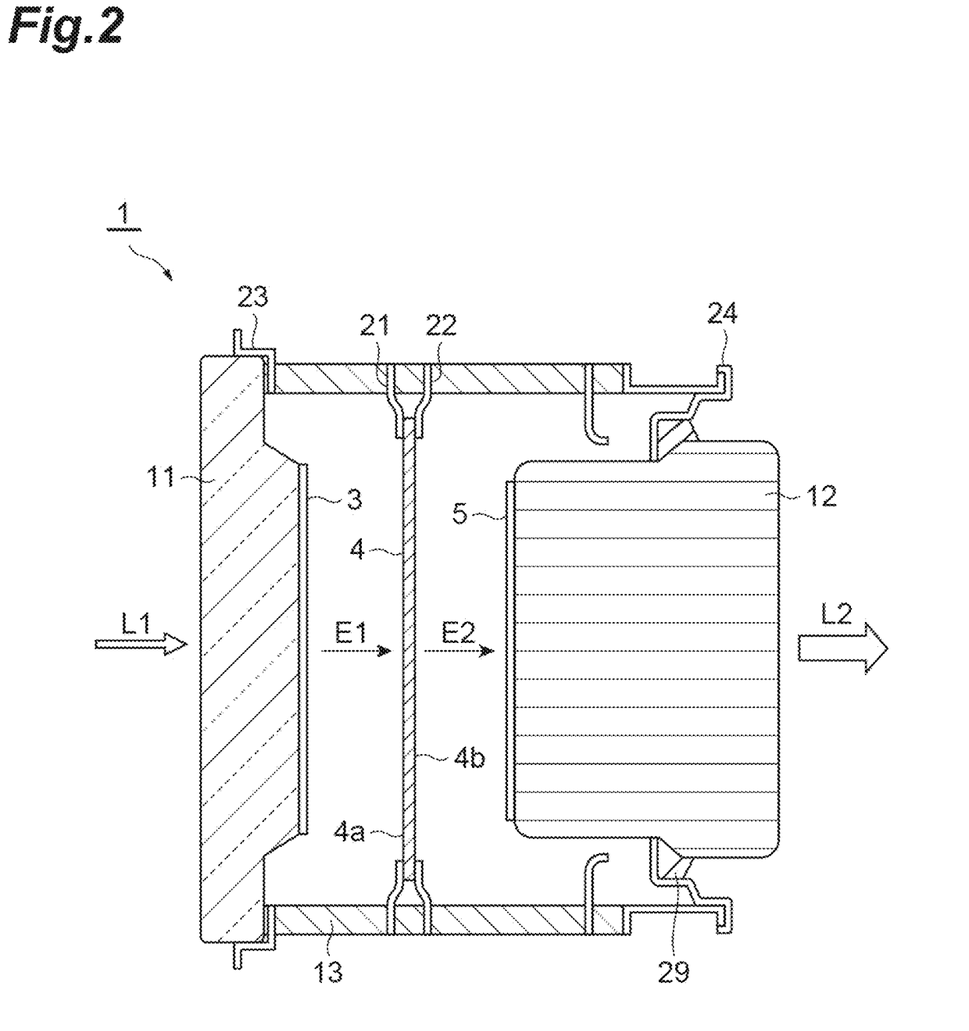
FIG. 2 is an enlarged cross-sectional view of a main part of the image intensifier shown in FIG. 1.

FIGS. 1 and 2 illustrate an image intensifier including a phosphor panel according to an embodiment. The image intensifier 1 of this embodiment includes a housing 2. The image intensifier 1 includes a photocathode 3, a microchannel plate 4 (electron multiplier), and a phosphor surface 5 inside the housing 2.

The inside of the image intensifier 1 is maintained in a high vacuum state by hermetically sealing both ends of a substantially hollow cylindrical housing 2 with a substantially disk-shaped entrance window 11 and exit window 12 (light transmissive substrates). The housing 2 includes, for example, a side tube 13 made of ceramic having a substantially hollow cylindrical shape, a mold member 14 made of silicone rubber having a substantially hollow cylindrical shape and covering a side portion of the side tube 13, and a case member 15 made of polyoxymethylene having a substantially hollow cylindrical shape and covering a side portion and a bottom portion of the mold member 14.

For example, two through holes are formed at both ends of the mold member 14. One end of the case member 15 is opened, and the other end of the case member 15 is formed with a through-hole whose periphery is aligned with one through-hole of the mold member 14. On one end side of the mold member 14, an entrance window 11 made of glass is joined to a surface around one through hole of the mold member 14. A thin-film photocathode 3 is provided substantially at the center of the vacuum-side surface of the entrance window 11. The entrance window 11 is a plate-shaped member made of, for example, quartz glass. A photocathode 3 is formed on the plate-shaped member. The photocathode 3 is formed of, for example, a compound of antimony and an alkali, a semiconductor crystal having a surface on which an alkali molecule such as Cs is adsorbed, or the like.

On the other hand, on the other end side of the mold member 14, an exit window 12 is fitted into the other through hole of the mold member 14. A thin-film phosphor surface 5 is provided at a substantially central portion of the vacuum-side surface of the exit window 12. The exit window 12 is, for example, a fiber optic plate (FOP) configured by bundling a plurality of optical fibers. The optical axes of the respective optical fibers of the exit window 12 are orthogonal to the photocathode 3, and the vacuum-side end surfaces thereof are flush with each other. A phosphor surface 5 is provided on the vacuum-side surface of the exit window 12. The exit window 12 and the phosphor surface 5 constitute a phosphor panel 30.

A substantially disk-shaped microchannel plate 4 is disposed between the photocathode 3 and the phosphor surface 5. The microchannel plate 4 is supported by an inner edge of a mounting members 21 and 22 fixed to an inner wall of the side tube 13, and faces the photocathode 3 and the phosphor surface 5 with a predetermined gap therebetween. The microchannel plate 4 functions as an electron multiplier that multiplies photoelectrons emitted from the photocathode 3. Specifically, microchannel plate 4 multiplies photoelectrons emitted from photocathode 3 and outputs the multiplied photoelectrons toward phosphor surface 5.

In the peripheral region of the vacuum-side surface of the entrance window 11, a metal electrode layer (not shown) is electrically connected to the photocathode 3. In order to connect the electrode layer to the photocathode 3, a mounting member 23 held between a side tube 13 and an entrance window 11 is extended into the mold member 14 and fixed. In the peripheral region of the vacuum-side surface of the exit window 12, another electrode layer (not shown) made of metal is electrically connected to the phosphor surface 5. In order to connect the other electrode layer to the phosphor surface 5, a mounting member 24 held between the side tube 13 and the mold member 14 is extended into the mold member 14 and fixed.

One end of each of lead wires 25 to 28 made of, for example, kovar metal is connected to an end of each of the mounting members 21 to 24. The other ends of the lead wires 25 to 28 airtightly penetrate the mold member 14 and the case member 15 to protrude to the outside, and are electrically connected to an external voltage source (not shown). Thus, a predetermined voltage from the external voltage source is applied to the photocathode 3, the microchannel plate 4, and the phosphor surface 5. A potential difference of, for example, about 200V is set between the photocathode 3 and an input surface 4a of the microchannel plate 4. A potential difference of, for example, about 500V to 1200V is variably set between the input surface 4a and an output surface 4b of the microchannel plate 4. A potential difference of, for example, about 6 kV is set between the output surface 4b of the microchannel plate 4 and the phosphor surface 5.

Next, the operation of the image intensifier 1 will be described. When the incident light L1 is incident on the photocathode 3 through the entrance window 11, the photocathode 3 emits photoelectrons E1 in response to the incident light L1. When the photoelectrons E1 are incident on the input surface 4a of the microchannel plate 4, the microchannel plate 4 multiplies the photoelectrons E1 and emits the multiplied photoelectrons E2 to the phosphor surface 5. When photoelectrons E2 are incident on phosphor surface 5, phosphor surface 5 emits fluorescence L2 corresponding to photoelectrons E2. The fluorescence L2 (light image) emitted from the phosphor surface 5 passes through the exit window 12 and is then acquired by an imaging unit such as a CCD camera.

[Structure of Phosphor Panel]

Figure 3:
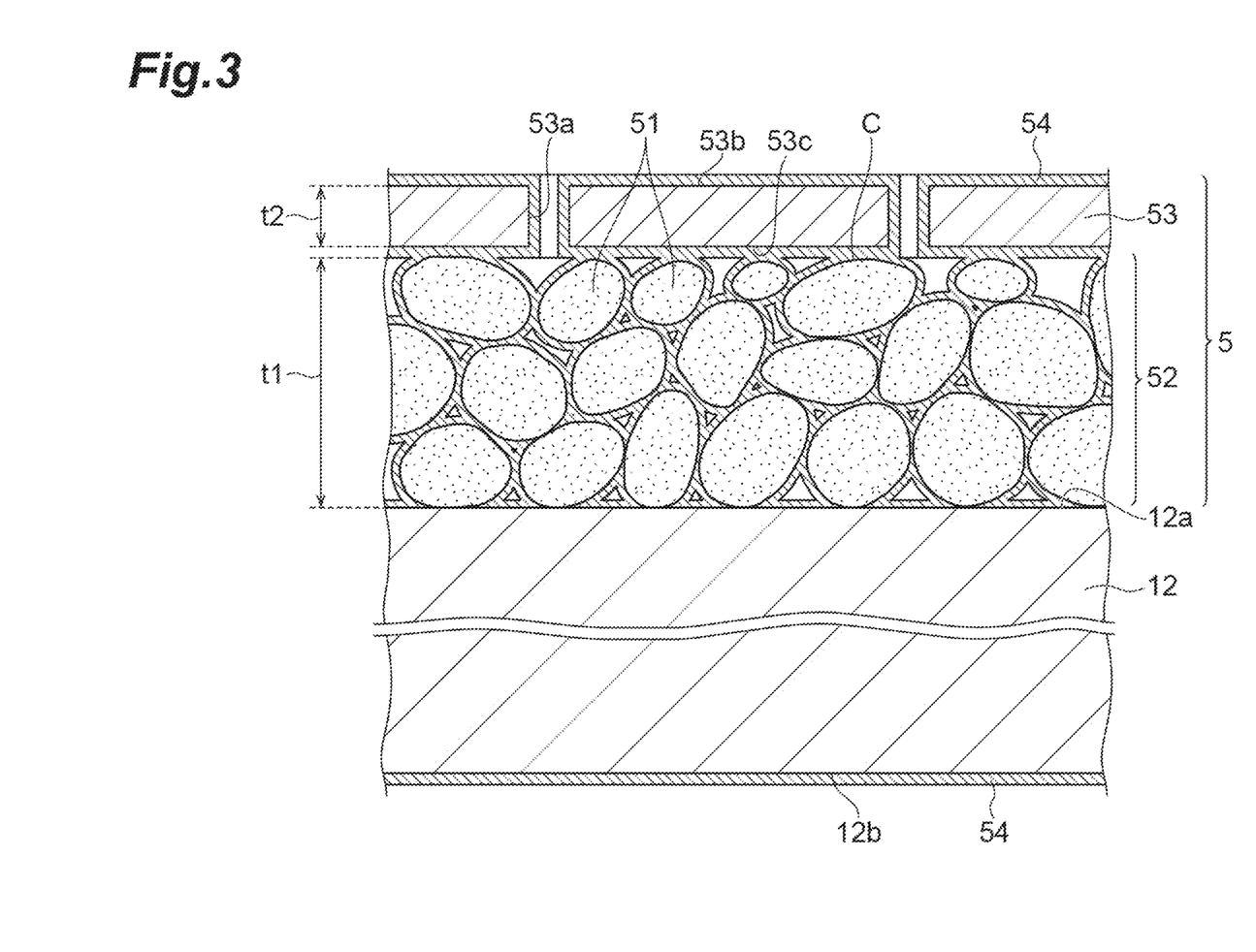
FIG. 3 is a schematic cross-sectional view showing a main part of the phosphor panel.
Figure 4:
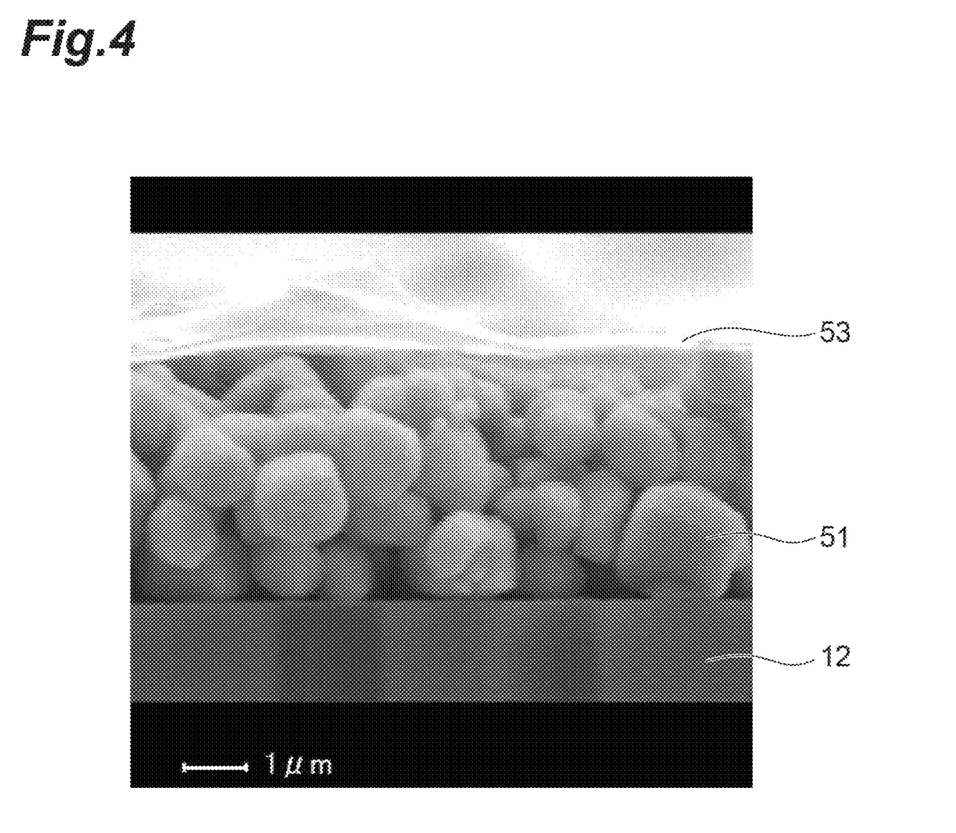
FIG. 4 shows an SEM image of a phosphor panel.

Next, the structure of the phosphor panel 30 will be described with reference to FIGS. 3 and 4. FIG. 3 is a schematic cross-sectional view showing a portion of exit window 12 where phosphor surface 5 is provided. FIG. 4 is an SEM image showing a cross section of a part of the phosphor panel 30. As shown in FIG. 3, the phosphor panel 30 includes the above-described exit window 12, a phosphor layer 52 having a plurality of phosphor particles 51, a metal reflection film 53, and an oxide film 54. The phosphor surface 5 includes a phosphor layer 52, a metal reflection film 53, and an oxide film 54 covering the phosphor layer 52 and the metal reflection film 53. The exit window 12 functions as a light transmissive substrate that transmits the fluorescence L2.

The phosphor layer 52 is provided on the exit window 12 (the inner surface 12a which is the vacuum-side surface of the exit window 12). The phosphor layer 52 is formed on the exit window 12 by, for example, a manufacturing method (precipitation method or the like) described later. The thickness t1 of the phosphor layer 52 is, for example, about 4 μm to 8 μm. The phosphor layer 52 is configured as an aggregate of a plurality of phosphor particles 51. The particle diameter of the phosphor particle 51 is, for example, about 1 μm to 4 μm. The center value of the particle size distribution of the phosphor particles 51 is about 2 μm. The phosphor particles 51 have a property of emitting fluorescence corresponding to the incident photoelectrons. The phosphor particle 51 is, for example, gadolinium oxysulfide (GOS). The phosphor layer 52 includes a binder for binding (adhering) the plurality of phosphor particles 51 to each other. In the present embodiment, the binder C made of potassium silicate adheres to the surface of the phosphor particle 51. Adjacent phosphor particles 51 are bonded to each other via the binder C.

The metal reflection film 53 is provided on the phosphor layer 52 (on the side opposite to the exit window 12 side of the phosphor layer 52). The metal reflection film 53 is a so-called metal back, and has a relatively high reflectance with respect to the light passing through the microchannel plate 4 and a relatively high transmittance with respect to the photoelectron E2 from the microchannel plate 4. The metal reflection film 53 is formed of, for example, an aluminum film. The thickness t2 of the metal reflection film 53 is, for example, about 50 nm to 120 nm. The metal reflection film 53 has a function of preventing charge-up of the phosphor layer 52, a function of reflecting fluorescence from the phosphor particles 51 toward the exit window 12, and the like. As will be described in detail later, the metal reflection film 53 is formed on the phosphor layer 52 by performing a process of removing an organic film after performing vapor deposition or sputtering of a metal material (aluminum in the present embodiment) on the organic film provided on the phosphor layer 52. The metal reflection film 53 thus formed has openings 53a such as pinholes scattered therein.

The oxide film 54 is formed so as to integrally cover the surface of the metal reflection film 53 and the surfaces of the phosphor particles 51. The oxide film 54 is preferably formed of a material having a relatively high electron transmittance so as not to inhibit electrons from entering the phosphor particles 51. From such a viewpoint, the oxide film 54 is preferably formed of an element having a relatively small atom number.

The oxide film 54 is formed by performing film formation by atomic layer deposition (ALD) on a formed body in which the exit window 12, the phosphor layer 52, and the metal reflection film 53 are formed in a layered manner as described above. Since film formation by ALD is a technique based on the principle of gas adsorption, film formation can also be performed inside the formed body by allowing gas to enter the inside of the formed body from a gap of the formed body (for example, the opening 53a of the metal reflection film 53, the gap between the phosphor layer 52 and the inner surface 12a of the exit window 12, the gap between the phosphor layer 52 and the inner surface 53c of the metal reflection film 53, etc.). In addition, according to ALD, a dense continuous film without gaps can be formed even on a fine uneven surface.

Accordingly, as shown in FIG. 3, the oxide film 54 is formed not only on the outer surface of the formed body (the outer surface 53b of the metal reflection film 53 and the outer surface 12b of the exit window 12) but also inside the formed body (the surface of the opening 53a and the inner surface 53c of the metal reflection film 53, the inner surface 12a of the exit window 12, and the surfaces of the phosphor particles 51). The oxide film 54 is integrally (continuously) formed on the outer surface and inside of the formed body. The oxide film 54 covers the surface of the phosphor particle 51 so as to contain the binder C adhered to the surface of the phosphor particle 51. The thickness of the oxide film 54 is, for example, about 3 nm to 12 nm.

From the viewpoint of suitably performing film formation by ALD, the material of the oxide film 54 is preferably an oxide of Be, Mg, Al, Si, Ca, Ti, Cr, Mn, Fe, Co, Ni, Cu, Zn, Ga, Ge, Sr, Y, Sn, Ba, Hf, Ta, W, Ir, or the like. Further, the oxide film 54 is preferably an aluminum oxide film ($Al_2O_3$), a titanium oxide film ($TiO_2$), a zinc oxide film (ZnO), or a silicon oxide film ($SiO_2$). With such a material, film formation by ALD can be relatively easily performed, and a dense and continuous film can be favorably formed. In the present embodiment, as an example, the oxide film 54 is an aluminum oxide film having a thickness of 5 nm formed by ALD.

[Method of Manufacturing Phosphor Panel]

Figure 5:
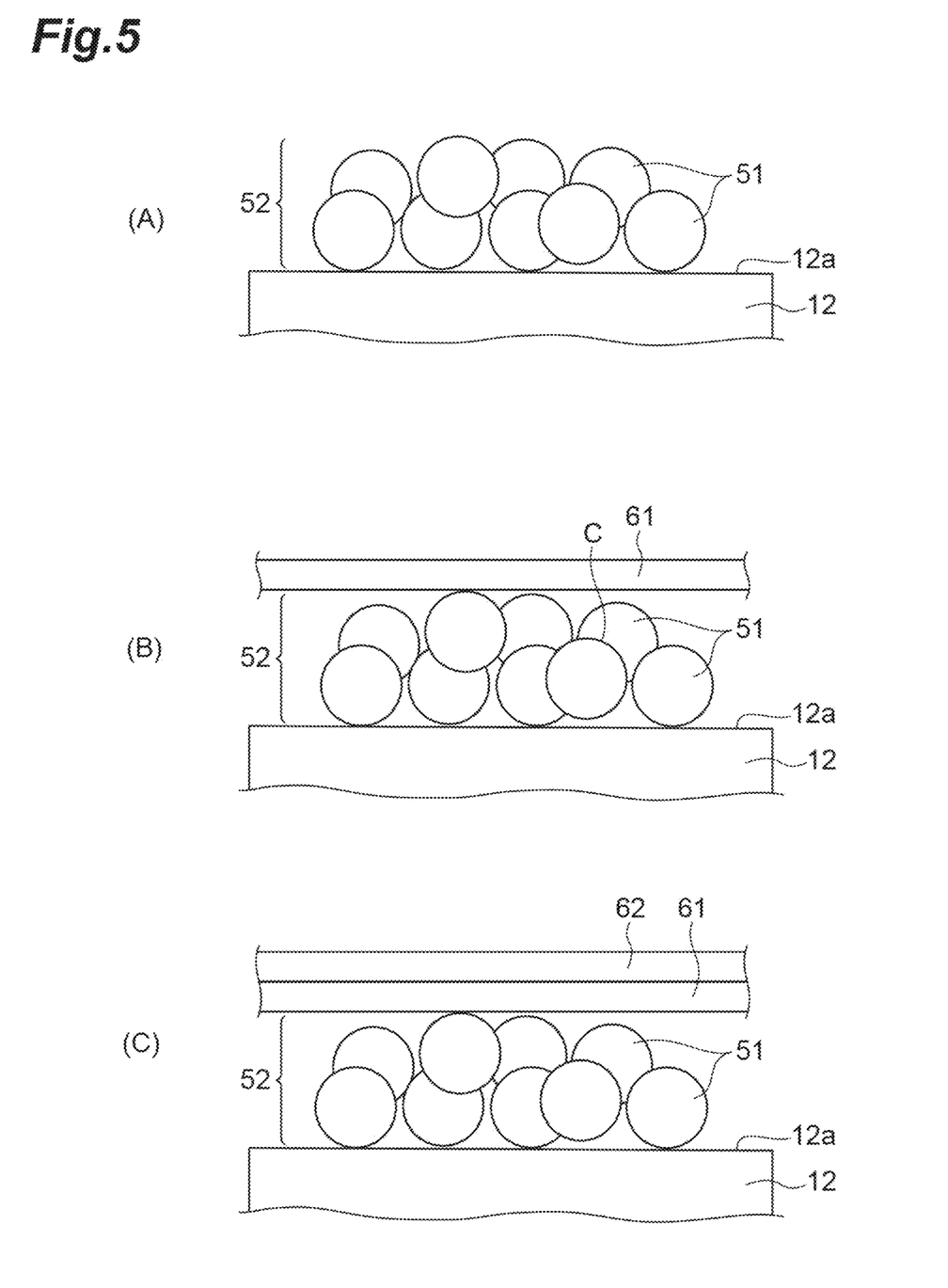
FIG. 5 is a view showing a manufacturing process of a phosphor panel.
Figure 6:
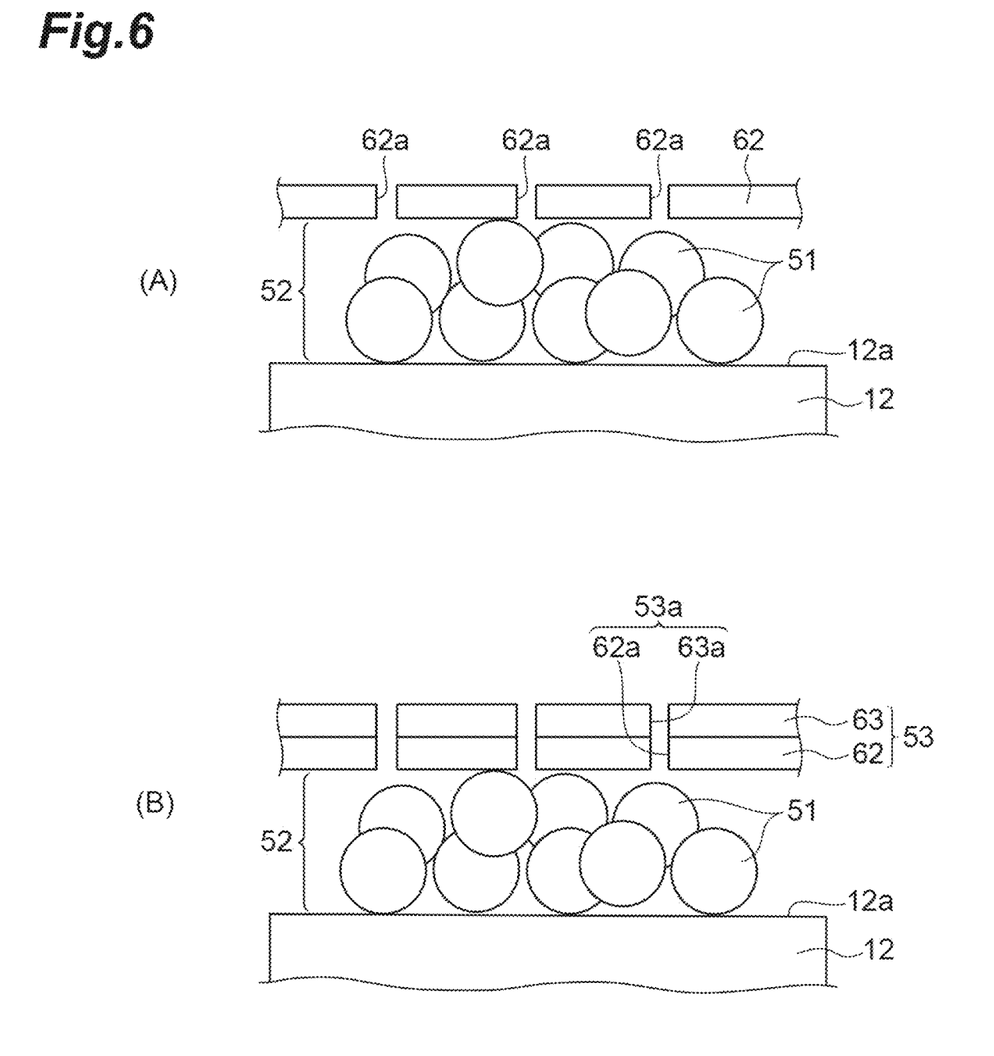
FIG. 6 is a view showing a manufacturing process of a phosphor panel.

Next, a method of manufacturing the phosphor panel 30 will be described with reference to FIGS. 5 and 6. FIG. 5 and FIG. 6 are schematic views showing the manufacturing process of the phosphor panel 30. As a preparation step, a fluorophore solution is prepared. First, a plurality of phosphor particles 51 are mixed with pure water and filtered potassium silicate. The solution thus obtained is then subjected to ultrasonic agitation. As a result, a solution in which the plurality of phosphor particles 51 are uniformly dispersed is obtained. Subsequently, the solution is further stirred with further addition of barium acetate.

Subsequently, for example, a mounting member 24 (metal flange, see FIGS. 1 and 2) is provided so as to surround the exit window 12 when viewed from the light emission direction of the exit window 12 (the direction orthogonal to the inner surface 12a). A cylinder (not shown) is fixed to the mounting member 24. The cylinder is arranged such that the inner surface 12a of the exit window 12 is located inside the cylinder. That is, the cylinder is fixed to the mounting member 24 such that the portion where the phosphor surface 5 is to be formed (i.e., the inner surface 12a of the exit window 12) is located inside the cylinder. At this time, the exit window 12 and the mounting member 24 are fixed to each other through the frit glass 29 (see FIG. 2).

Subsequently, the fluorescence substance solution prepared in the preparation step is placed in the cylinder fixed to the inner surface 12a as described above. The phosphor particles 51 contained in the fluorescence substance solution contained in the cylinder are allowed to stand for a certain period of time, and thereby settle on the inner surface 12a. Thereafter, the supernatant liquid in the cylinder and the moisture adhering to the surface of the phosphor particle 51 are carefully sucked. As a result, as shown in (A) of FIG. 5, a phosphor layer 52 having a plurality of phosphor particles 51 is formed on the inner surface 12a of the exit window 12.

Subsequently, after the exit window 12 and the phosphor particles 51 are dried, the surface of each phosphor particle 51 is immersed in potassium silicate. As a result, the binder C made of potassium silicate adheres to the surfaces of the phosphor particles 51, and the phosphor particles 51 are firmly bonded to each other via the binder C. As shown in (B) of FIG. 5, an organic film 61 is formed on the phosphor layer 52 (opposite to the exit window 12). In the present embodiment, the organic film 61 is a nitrocellulose film. The organic film 61 is provided substantially flat on the phosphor layer 52. That is, the organic film 61 is not provided along the surface shape of the phosphor particles 51, but is placed above the plurality of phosphor particles 51 while maintaining a substantially flat shape.

Subsequently, as shown in (C) of FIG. 5, a metal reflection film 62 (first metal reflection film) is formed on the organic film 61. In the present embodiment, as an example, the metal reflection film 62 is an aluminum film. The thickness of the metal reflection film 62 is, for example, about 10 nm to 20 nm. The metal reflection film 62 is provided on the organic film 61 by vapor deposition or sputtering. As described above, since the organic film 61 is provided substantially flat on the phosphor layer 52, the metal reflection film 62 can be formed substantially flat along the shape of the organic film 61.

Subsequently, the formed body including the exit window 12, the phosphor layer 52, the organic film 61, and the metal reflection film 62 as shown in (C) of FIG. 5 is fired. The formed body is fired, for example, in the atmosphere at 350 degrees Celsius. By firing, the organic film 61 is burned and removed. As a result, as shown in (A) of FIG. 6, the metal reflection film 62 is disposed on the phosphor layer 52. Note that openings 62a such as pinholes are scattered in the metal reflection film 62 formed by vapor deposition or sputtering.

Subsequently, as shown in (B) of FIG. 6, after the organic film 61 is removed, a metal reflection film 63 (second metal reflection film) is formed on the metal reflection film 62 located on the phosphor layer 52. This is because of the following reason. That is, a part of the metal reflection film 62 may be changed into a metal oxide film (alumina in the present embodiment) or damaged by firing for removing the organic film 61. As a result, a metal reflection film (here, an aluminum film) having a sufficient layer thickness is not ensured, and the metal reflection film 62 alone may not sufficiently exhibit the function as the metal back described above. Therefore, a metal reflection film 63 is formed on the metal reflection film 62 in order to secure a metal reflection film having a sufficient layer thickness. The metal reflection film 53 includes the metal reflection film 62 and the metal reflection film 63.

The metal reflection film 63 may be formed of the same material as the metal reflection film 62 or may be formed of a metal material different from the metal reflection film 62. In the present embodiment, as an example, the metal reflection film 63 is formed of the same aluminum as the metal reflection film 62. The metal reflection film 63 is formed on the metal reflection film 62 by vapor deposition or sputtering. The thickness of the metal reflection film 63 is, for example, about 40 nm to 100 nm. An opening 63a communicating with the opening 62a is formed in a portion of the metal reflection film 63 corresponding to the opening 62a of the metal reflection film 62. The opening 53a of the metal reflection film 53 is composed of an opening 62a and an opening 63a.

Subsequently, an oxide film 54 (see FIG. 3) is formed by atomic layer deposition (ALD) to integrally cover the surface of the metal reflection film 53 (metal reflection film 62 and metal reflection film 63) and the surfaces of the phosphor particles 51. In the present embodiment, film formation by ALD is performed on the entire formed body (exit window 12, phosphor layer 52, and metal reflection film 53) in the state shown in (B) of FIG. 6. As a result, as shown in FIG. 3, the oxide film 54 is formed on the outer surface of the formed body (the outer surface 53b of the metal reflection film 53 and the outer surface 12b of the exit window 12) and the inside of the formed body (the surface of the opening 53a and the inner surface 53c of the metal reflection film 53, the inner surface 12a of the exit window 12, and the surfaces of the phosphor particles 51).

When the surface of the metal reflection film 62 is changed to a metal oxide film in the firing (baking) process, the metal reflection film 53 and the oxide film 54 formed by ALD may have a structure in which a metal oxide film generated by baking is formed outside an aluminum film and an oxide film 54 formed by ALD is further formed outside the metal oxide film.

[Effects of Phosphor Panel]

In the phosphor panel 30 described above, the oxide film 54 is formed so as to integrally cover the surfaces (the outer surface 53b and the inner surface 53c) of the metal reflection film 53 and the surfaces of the phosphor particles 51. Since the surface of the metal reflection film 53 is protected by the oxide film 54, the strength of the metal reflection film 53 is improved. Furthermore, since the adhesion between the metal reflection film 53 and the phosphor layer 52 (phosphor particles 51) is improved via the oxide film 54, the metal reflection film 53 is less likely to be peeled off from the phosphor layer 52. Therefore, according to the phosphor panel 30, peeling of the metal reflection film 53 can be effectively suppressed.

In this embodiment, the metal reflection film 53 is an aluminum film. Accordingly, the function as the metal back described above (that is, the function of preventing charge-up of the phosphor layer 52, the function of reflecting the fluorescence L2 from the phosphor particle 51, and the like) can be suitably exhibited.

In the present embodiment, the oxide film 54 is formed of an aluminum oxide film. Accordingly, the strength of the metal reflection film 53 and the adhesion between the metal reflection film 53 and the phosphor layer 52 can be suitably improved. When the oxide film 54 is formed of a titanium oxide film, a zinc oxide film, or a silicon oxide film, the same effect as described above is obtained.

In the present embodiment, the phosphor particle 51 is gadolinium oxysulfide. Thus, the phosphor layer 52 of the phosphor panel 30 used as an electron detector in an image intensifier or the like can be suitably formed.

The phosphor layer 52 includes a binder C that binds the plurality of phosphor particles 51 to each other. Thus, the phosphor particles 51 are fixed to each other, and the structure of the phosphor layer 52 can be stabilized.

In this embodiment, binder C is potassium silicate. Accordingly, the phosphor particles 51 can be suitably bonded to each other.

In the present embodiment, the exit window 12 is a fiber optic plate (FOP) formed by bundling a plurality of optical fibers. Thus, the fluorescence L2 emitted from the phosphor layer 52 can be transmitted to the outside with high efficiency and low distortion.

[Effects of Image Intensifier]

The image intensifier 1 includes a photocathode 3 that emits a photoelectron E1 in response to incident light L1, a microchannel plate 4 that multiplies the photoelectron E1 emitted from the photocathode 3, and a phosphor panel 30. The phosphor panel 30 is disposed such that the phosphor layer 52 receives the photoelectron E2 multiplied by the microchannel plate 4 and emits fluorescence L2 corresponding to the photoelectron E2. That is, as shown in FIG. 2, phosphor surface 5 is arranged to face microchannel plate 4. In the image intensifier 1, since the metal reflection film 53 of the phosphor panel 30 is more difficult to peel off than in the related art, it is possible to improve handleability of the phosphor panel 30 at the time of manufacturing a product. That is, the phosphor panel 30 can be handled more easily than in the related art.

In addition, since the metal reflection film 53 is prevented from peeling off from the phosphor panel 30, it is possible to prevent the quality of the image intensifier 1 from deteriorating due to the peeling off of the metal reflection film 53. Specifically, in an image intensifier, it is known that peeling of a metal reflection film (metal back) may cause deterioration in image quality of an image obtained by the image intensifier. Therefore, according to the above-described image intensifier 1, it is possible to suppress a decrease in image quality due to peeling of the metal reflection film 53.

Further, since the phosphor particles 51 are covered with the oxide film 54, absorption of gas to the phosphor particles 51 (or the binder C adhered to the phosphor particles 51) is suppressed, and emission of gas from the phosphor particles 51 during the operation of the image intensifier 1 is suppressed. Accordingly, it is possible to suppress a phenomenon (ion feedback) in which the gas emitted from the phosphor particle 51 is ionized and reaches the photocathode 3, and to suppress deterioration of the photocathode 3 (deterioration of cathode sensitivity) due to the phenomenon. As a result, the life characteristic (product life) of the image intensifier 1 can be improved. In particular, potassium silicate used as the binder C has a property of relatively easily adsorbing gas. Therefore, when potassium silicate is used as the binder C as in the present embodiment, it can be said that the above-described effect obtained by covering the phosphor particles 51 with the oxide film 54 is particularly large.

Figure 7:
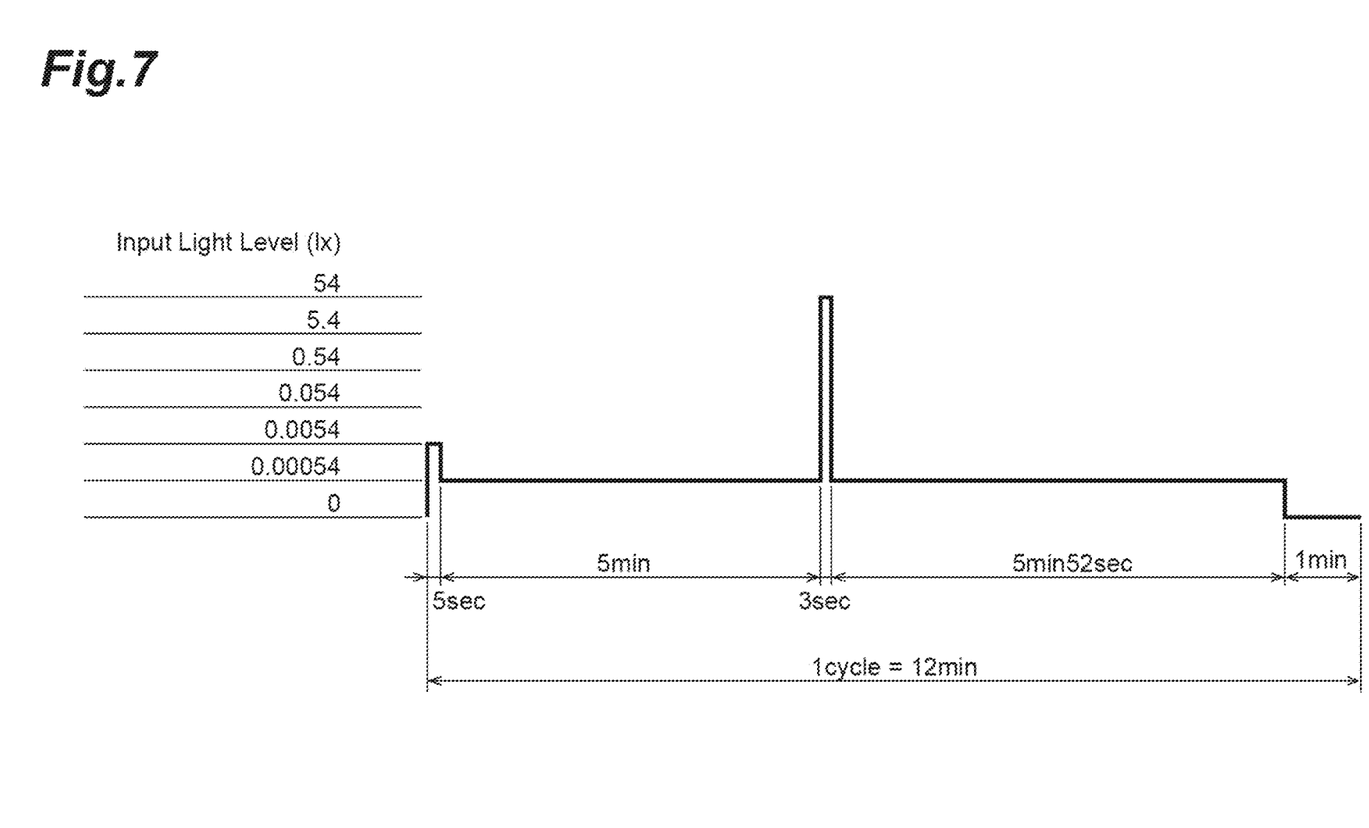
FIG. 7 is a diagram showing light irradiation conditions in the life test (MTTF test).
Figure 8:
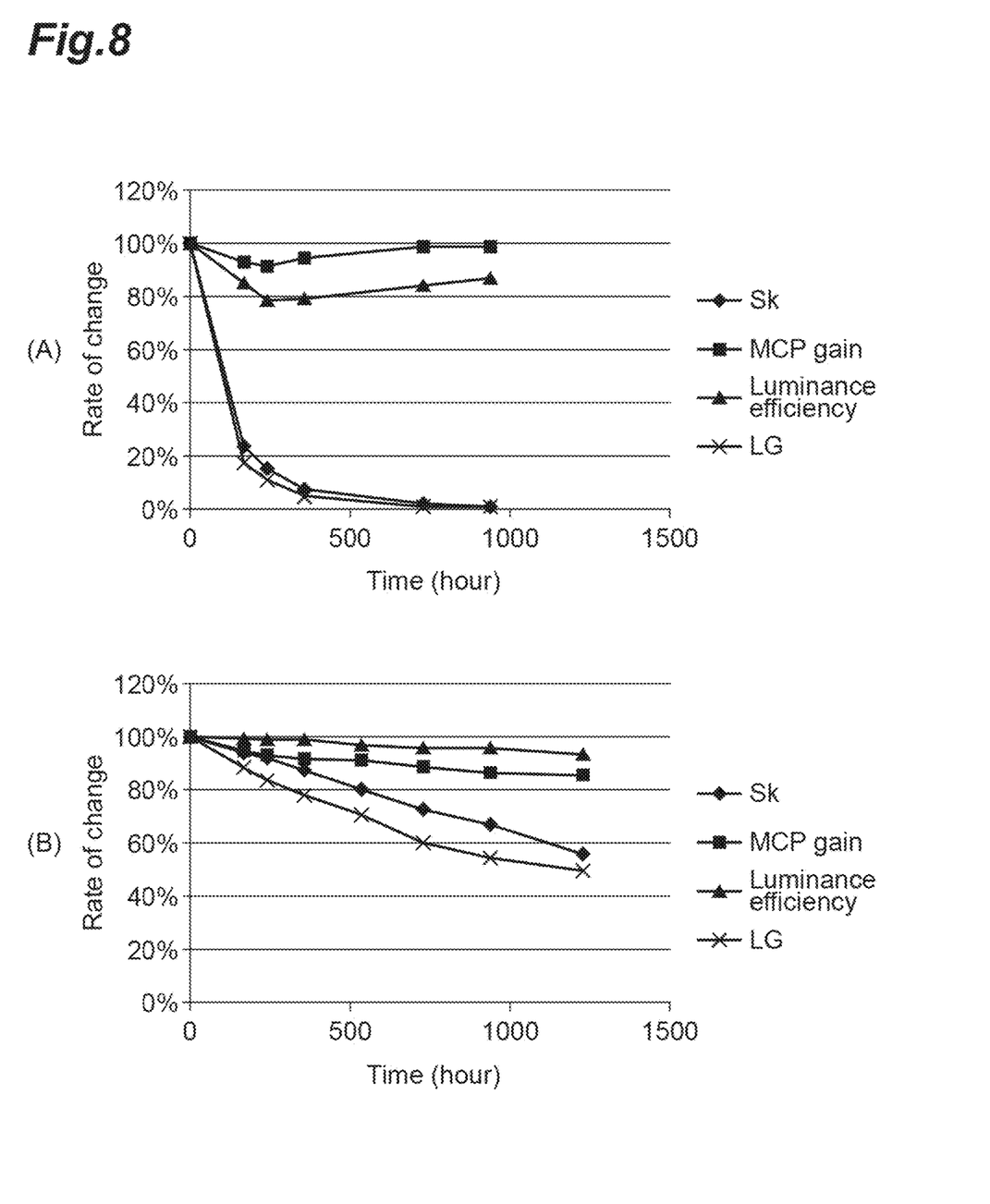

Referring to FIGS. 7 and 8, the effect of improving the life characteristics in the image intensifier 1 will be described in detail. FIG. 7 is a diagram showing light irradiation conditions in the life test (MTTF test). (A) of FIG. 8 shows a test result of an image intensifier according to a comparative example (hereinafter simply referred to as "comparative example"). (B) of FIG. 8 shows a test result of an image intensifier according to an example (hereinafter, simply referred to as "example"). Here, the example is an image intensifier having the same configuration as the image intensifier 1 described above. Specifically, the example includes the above-described phosphor panel 30 as the phosphor panel. On the other hand, the comparative example is an image intensifier including a phosphor panel in which the formation of the oxide film 54 by ALD is omitted.

More specifically, the example is an image intensifier obtained as follows. That is, in the manufacturing process of the example, the phosphor panel in the state (that is, the state shown in (B) of FIG. 6) before the film formation by ALD described above is performed was subjected to a firing (baking) process of heating at 350 degrees Celsius for 8 hours in a vacuum. Thereafter, the oxide film 54 was formed on the phosphor panel by ALD. Thereafter, the phosphor panel 30 thus obtained was sealed in a housing 2 together with a photocathode 3 and a microchannel plate 4 to obtain the example. On the other hand, in the manufacturing process of the comparative example, the phosphor panel in the state shown in (B) of FIG. 6 was subjected to a firing (baking) process of heating at 350 degrees Celsius for 20 hours in vacuum. Thereafter, the phosphor panel immediately after the firing process was performed was sealed in a housing together with a photocathode and a microchannel plate to obtain the comparative example.

In the life test, the entrance window 11 of each of the above-described example and comparative example was repeatedly irradiated with light under the light irradiation conditions shown in FIG. 7. That is, as shown in FIG. 7, each of the example and the comparative example was intermittently irradiated with light whose light intensity regularly changed in the range of 0.00054 lux to 54 lux within 12 minutes.

As a result, test results as shown in FIG. 8 were obtained. In FIG. 8, "Sk" is the emission sensitivity (cathode sensitivity) of the photocathode. "MCP gain" is the gain of the microchannel plate. "LG (Luminescence Gain)" is an indicator corresponding to the amount of fluorescence emitted from a phosphor layer. LG is a value obtained by the product of Sk, MCP gain, and luminance efficiency. The horizontal axis of FIG. 8 indicates the elapsed time from the start of light irradiation. The vertical axis of FIG. 8 indicates a state where the state at the start of the test is set as a reference (100%). As shown in (A) of FIG. 8, in the comparative example, Sk and LG decrease to about 10% at the time when about 300 hours have elapsed from the start of the life test (light irradiation). On the other hand, as shown in (B) of FIG. 8, in the example, Sk and LG are maintained in a state of 40% or more even at the time when 1000 hours have elapsed from the start of the life test. That is, in the comparative example, LG is decreased due to the decrease in Sk. On the other hand, in the example, since the deterioration rate of Sk is slower than that in the comparative example, the state in which LG is relatively high can be maintained even after a long time has elapsed. From the above, in the example, it is considered that the above-described oxide film 54 is formed so as to include the phosphor particles 51 and the binder C, and thus the gas release from the phosphor particles 51 and the binder C is suppressed. As a result, in the example, it is considered that the above-described ion feedback was suppressed and the deterioration of Sk was suppressed.

[Effects of Method of Manufacturing Phosphor Panel]

The method of manufacturing the phosphor panel 30 according to the present embodiment includes: forming a phosphor layer 3 having a plurality of phosphor particles 51 on an exit window 12 (see (A) of FIG. 5); forming an organic film 61 on the phosphor layer 52 (see (B) of FIG. 5); forming a metal reflection film 62 (a portion of the metal reflection film 53) on the organic film 61 (see (C) of FIG. 5); removing the organic film 61 by firing (see (A) of FIG. 6); and forming an oxide film 54 integrally covering a surface of the metal reflection film 53 and surfaces of the phosphor particles 51 by ALD.

In the manufacturing method, the metal reflection film 62 is formed on the organic film 61 formed on the phosphor layer 52. Accordingly, the metal molecules constituting the metal reflection film 62 are prevented from being mixed into the phosphor layer 52, and the metal reflection film 53 can be appropriately provided on the phosphor layer 52. After the organic film 61 is removed by firing, the oxide film 54 is formed by ALD so as to integrally cover the surface of the metal reflection film 53 and the surfaces of the phosphor particles 51. As a result, as described above, the strength of the metal reflection film 53 is improved. Furthermore, since the adhesion between the metal reflection film 53 and the phosphor layer 52 (phosphor particles 51) is improved through the oxide film 54, the metal reflection film 53 is less likely to be peeled off from the phosphor layer 52. Therefore, according to the above-described manufacturing method, the phosphor panel 30 in which peeling of the metal reflection film 53 is effectively suppressed can be manufactured.

To supplement the above effects, it is known to provide a coating layer of aluminum oxide or the like continuously coating the surfaces of a plurality of phosphor particles, as described in Japanese Unexamined Patent Publication No. 2013-216800, for example. However, it should be noted that the above-described effect of the present embodiment cannot be obtained only by continuously coating the surfaces of a plurality of phosphor particles. That is, in the above-described manufacturing method, the oxide film 54 is continuously formed over the metal reflection film 53 and the phosphor layer 52 by performing film formation by ALD in a state where the metal reflection film 53 is formed on the phosphor layer 52. As a result, the adhesion between the metal reflection film 53 and the phosphor layer 52 can be improved, and damage such as peeling of the metal reflection film 53 can be effectively suppressed.

The organic film 61 is a nitrocellulose film. Accordingly, the organic film 61 suitable for forming the metal reflection film 53 can be suitably formed. The metal reflection film 53 is formed by vapor deposition or sputtering. Accordingly, the metal reflection film 53 can be suitably formed on the organic film 61. Further, the metal reflection film 53 in which the opening 53a (pinhole) is appropriately provided is formed by vapor deposition or sputtering. Accordingly, in the film formation of the oxide film 54 by ALD, the gas for forming the oxide film 54 can be suitably introduced into the phosphor layer 52 through the opening 53a of the metal reflection film 53. As a result, the oxide film 54 can be suitably formed.

The method further includes forming a metal reflection film 63 on the metal reflection film 62 which is the metal reflection film located on the phosphor layer 52 after the organic film 61 is removed (see (B) of FIG. 6). In the process of forming the oxide film 54, the oxide film 54 is formed to cover the metal reflection film 53 (i.e., the metal reflection film 62 and the metal reflection film 63) and the phosphor particles 51. In the above-described manufacturing method, a part of the metal reflection film 62 initially formed on the organic film 61 may be changed into a metal oxide film (alumina in this embodiment) or damaged by the firing step. As a result, the metal reflection film 62 initially formed on the organic film 61 may not sufficiently function as a metal reflection film for preventing charge-up of the phosphor layer 52. On the other hand, according to the above-described manufacturing method, the function as the above-described metal reflection film can be ensured by the metal reflection film 62 and the metal reflection film 63.

The thickness of the metal reflection film 62 (15 nm in this embodiment) is smaller than the thickness of the metal reflection film 63 (70 nm in this embodiment). In this manner, by forming the metal reflection film 62 formed on the organic film 61 to be relatively thin before the firing step, the organic film 61 can be suitably removed in the firing step. In addition, since the relatively thick metal reflection film 62 is formed after the organic film 61 is removed, the entire thickness of the metal reflection film (the thickness t2 of the metal reflection film 53) may be sufficiently secured.

[Configuration of Scanning Electron Microscope]

Figure 9:
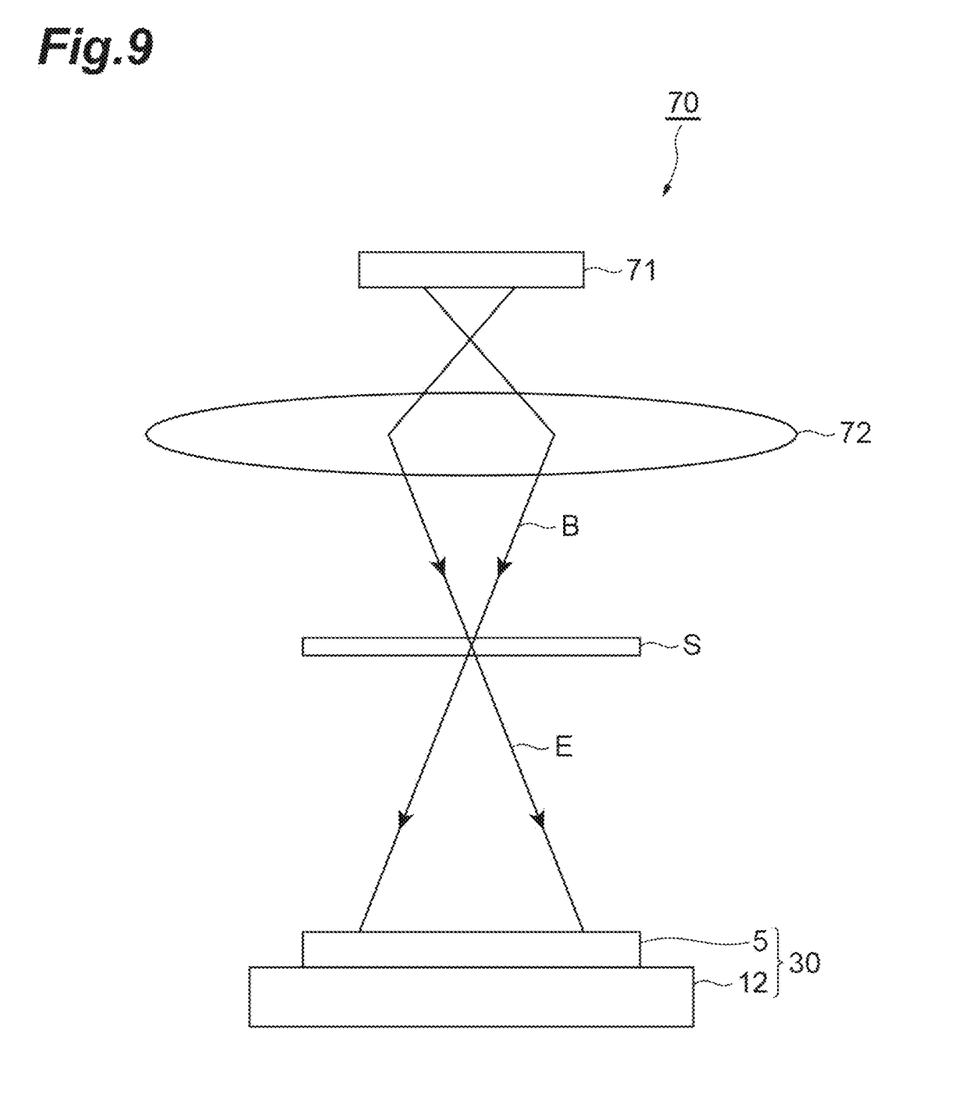
FIG. 9 is a schematic configuration diagram of a scanning electron microscope including a phosphor panel according to an embodiment.

The phosphor panel 30 may be used in various optical devices in addition to the image intensifier. For example, the phosphor panel 30 may be used as an electron detector in a scanning electron microscope. FIG. 9 is a schematic configuration diagram of a scanning electron microscope according to an embodiment. As shown in FIG. 9, a scanning electron microscope 70 according to this embodiment includes an electron gun 71 that generates an electron beam, an irradiation part 72 that irradiates a sample S with an electron beam B and scans the irradiation position of the electron beam on the sample S, and a phosphor panel 30. The phosphor panel 30 is disposed so that the phosphor layer 52 receives the photoelectron E generated in the sample S in response to the irradiation of the electron beam to the sample S and emits fluorescence corresponding to the photoelectron E. That is, as shown in FIG. 9, phosphor surface 5 is arranged to face sample S. In the scanning electron microscope 70, similarly to the image intensifier 1 described above, the metal reflection film 53 of the phosphor panel 30 is less likely to be peeled off than in the related art, and thus it is possible to improve handleability of the phosphor panel 30 at the time of manufacturing a product. That is, the phosphor panel 30 can be handled more easily than in the related art. Although the scanning electron microscope 70 is a so-called transmission type scanning electron microscope in which the incident surface of the electron beam B and the emission surface of the photoelectron E in the sample S are positioned on opposite sides, the phosphor panel 30 may be used as an electron detection unit of a so-called reflection type scanning electron microscope in which the incident surface of the electron beam and the emission surface of the photoelectron in the sample are the same.

Although an embodiment of the present disclosure has been described above, the present disclosure is not limited to the above-described embodiment. For example, the material and shape of each component are not limited to those described above, and various materials and shapes can be adopted. For example, the exit window 12 may be formed by a glass substrate instead of the FOP.

In addition, mainly in the image intensifier, the following film forming process may be additionally performed in order to enhance the ion feedback suppression effect described above. That is, after the phosphor layer 52 is formed on the exit window 12 (the state shown in (A) of FIG. 5), an oxide film (for example, aluminum oxide) integrally covering the surface of the phosphor layer 52 (that is, the surface of each phosphor particle 51) may be formed by ALD. Alternatively, an oxide film may be formed on the surface of each phosphor particle 51 before preparing the fluorescence solution. That is, the phosphor solution may be prepared using the phosphor particles 51 on which an oxide film is formed in advance. According to the above-described procedure, the phosphor particles 51 can be covered with the oxide film as early as possible in the manufacturing process of the phosphor panel 30, so that the adsorption of the gas to the phosphor particles 51 can be effectively suppressed. When the film is formed on the surface of the phosphor layer 52 by ALD as described above and the phosphor particles 51 are fixed to each other by the oxide film formed by the film formation, the binder C (potassium silicate) in the above embodiment may be omitted. That is, in the state shown in (A) of FIG. 5, the step of immersing the surface of each phosphor particle 51 in potassium silicate may be omitted.

Although the metal reflection film 63 is formed on the metal reflection film 62 in the above embodiment (see (B) of FIG. 6), the formation of the metal reflection film 63 may be omitted if the metal reflection film 62 after the organic film 61 is removed can sufficiently exhibit the function as the metal back described above. In this case, the metal reflection film 53 in the above embodiment is constituted only by the metal reflection film 62.

REFERENCE SIGNS LIST 1 image intensifier
3 photocathode
4 microchannel plate (electron multiplier)
5 phosphor surface
12 exit window (light transmissive substrate)
30 phosphor panel
51 phosphor particle
52 phosphor layer
53 metal reflection film
54 oxide film
61 organic film
62 metal reflection film (first metal reflection film)
63 metal reflection film (second metal reflection film)
70 scanning electron microscope
71 electron gun
72 irradiation part
B electron beam
C binder
E, E1, E2 photoelectron
L1 incident light
L2 fluorescence
S sample

The invention claimed is:

1. A method of manufacturing a phosphor panel, comprising:
   forming a phosphor layer having a plurality of phosphor particles on a light transmissive substrate;
   forming an organic film on the phosphor layer;
   forming a metal reflection film on the organic film;
   removing the organic film by firing;
   forming an oxide film integrally covering a surface of the metal reflection film and surfaces of the phosphor particles by atomic layer deposition.

2. The method of manufacturing a phosphor panel according to claim 1, wherein the organic film is a nitrocellulose film.

3. The method of manufacturing a phosphor panel according to claim 1, wherein the forming the metal reflection film is performed by vapor deposition or sputtering.

4. The method of manufacturing a phosphor panel according to claim 1, further comprising forming a second metal reflection film on a first metal reflection film which is the metal reflection film located on the phosphor layer after the organic film is removed, and wherein, in the forming the oxide film, the oxide film is formed to cover the first metal reflection film, the second metal reflection film, and the phosphor particles.

5. A phosphor panel, comprising:
a light transmissive substrate;
a phosphor layer disposed on the light transmissive substrate and having a plurality of phosphor particles;
a metal reflection film disposed on the phosphor layer;
an oxide film integrally covering a surface of the metal reflection film and surfaces of the phosphor particles.

6. The phosphor panel according to claim 5, wherein the metal reflection film is an aluminum film.

7. The phosphor panel according to claim 5, wherein the oxide film is an aluminum oxide film, a titanium oxide film, a zinc oxide film, or a silicon oxide film.

8. The phosphor panel according to claim 5, wherein the phosphor particle is gadolinium oxysulfide.

9. The phosphor panel according to claim 5, wherein the phosphor layer contains a binder that binds the plurality of phosphor particles to each other.

10. The phosphor panel according to claim 9, wherein the binder is potassium silicate.

11. The phosphor panel according to claim 5, wherein the light transmissive substrate is a fiber optic plate formed by bundling a plurality of optical fibers.

12. An image intensifier, comprising:
a photocathode configured to emit photoelectrons in response to incident light;
an electron multiplier configured to multiply the photoelectrons emitted from the photocathode; and
the phosphor panel according to claim 5, which is disposed so that the phosphor layer receives the photoelectron multiplied by the electron multiplier and emits fluorescence corresponding to the photoelectron.

13. A scanning electron microscope comprising:
an electron gun configured to generate an electron beam;
an irradiation part configured to irradiate a sample with the electron beam and scan an irradiation position of the electron beam on the sample; and
the phosphor panel according to claim 5, which is disposed so that the phosphor layer receives a photoelectron generated in the sample in response to irradiation of the sample with the electron beam and emits fluorescence corresponding to the photoelectron.

* * * * *